United States Patent
Soubhi (10) Patent No.: US 12,135,624 B2
(45) Date of Patent: Nov. 5, 2024

(54) CIRCUITS, SYSTEMS, AND METHODS FOR ECC FAULT DETECTION

(71) Applicant: Renesas Electronics Corporation, Tokyo (JP)

(72) Inventor: Mohamed Soubhi, Dusseldorf (DE)

(73) Assignee: Renesas Electronics Corporation, Tokyo (JP)

(*) Notice: Subject to any disclaimer, the term of this patent is extended or adjusted under 35 U.S.C. 154(b) by 49 days.

(21) Appl. No.: 18/065,813

(22) Filed: Dec. 14, 2022

(65) Prior Publication Data
US 2024/0202086 A1    Jun. 20, 2024

(51) Int. Cl.
*G06F 11/22* (2006.01)
*H03M 13/01* (2006.01)
*G11C 29/42* (2006.01)
*G11C 29/52* (2006.01)

(52) U.S. Cl.
CPC ....... *G06F 11/2215* (2013.01); *H03M 13/015* (2013.01); *G11C 29/42* (2013.01); *G11C 29/52* (2013.01)

(58) Field of Classification Search
CPC ............... G06F 11/2215; H03M 13/015
See application file for complete search history.

(56) References Cited

U.S. PATENT DOCUMENTS

| | | | | |
|---|---|---|---|---|
| 4,727,548 A | * | 2/1988 | Dickey ............... | G06F 11/0751 |
| | | | | 714/E11.053 |
| 2002/0157044 A1 | * | 10/2002 | Byrd .................. | H04L 41/0893 |
| | | | | 714/703 |
| 2014/0075272 A1 | * | 3/2014 | Kern ................... | G06F 11/2215 |
| | | | | 714/E11.032 |
| 2019/0102271 A1 | * | 4/2019 | Matsukawa ......... | G06F 11/1608 |

* cited by examiner

*Primary Examiner* — Joseph D Torres
(74) *Attorney, Agent, or Firm* — SCULLY, SCOTT, MURPHY & PRESSER, P.C.

(57) ABSTRACT

A detection circuit for detecting faulty operation of an error correction code (ECC) decoder that is configured for diagnosing whether an error has occurred in input data to the ECC decoder, wherein the ECC decoder is further configured for outputting an error detection signal indicative of whether the error has been detected and potentially corrected by the ECC decoder and output data based on the input data, and wherein the detection circuit includes a first stage configured to generate a first check signal indicative of whether there is a mismatch between the input data and the output data of the ECC decoder, and a second stage configured to generate a second check signal indicative of whether faulty operation of the ECC decoder has been detected based on the first check signal and the error detection signal of the ECC decoder.

17 Claims, 4 Drawing Sheets

CIRCUITS, SYSTEMS, AND METHODS FOR ECC FAULT DETECTION

TECHNICAL FIELD

The present disclosure is generally directed to techniques for error correction code (ECC), and more particularly to techniques for detecting faulty operation of an ECC decoder.

BACKGROUND

In a broad sense, techniques related to error correction (or correcting) code (ECC) are widely used, e.g., in the technical fields of computing, telecommunication, automotive, etc., for controlling (e.g., detecting, correcting, etc.) errors in data transmitted over unreliable or noisy communication channels. The general idea is that a sender (sometimes also referred to as a transmitting (side) entity/component) may encode the message with certain redundant information in the form of an ECC. Such redundancy would then allow the receiver to detect a limited number of errors (e.g., 1 bit error, 2 bit error, etc.) that may occur anywhere in the message, and additionally, in some possible implementations, to also correct these errors (or part thereof) without retransmission. Thus, generally speaking, the ECC may be considered an active (in the sense that it can change/correct the error/fault) safety mechanism.

However, also due to its "active" nature, in some possible cases the ECC may result in performing a wrong correction, i.e., correction at a wrong bit location. In some other possible cases, the ECC may result in performing a correction while it shall not be (i.e., when there is in fact no data corruption). Moreover, in some further possible cases, the ECC may also notify a correctable error, but the ECC decoder may not be able to correct such error.

Thus, in many implementations (particularly in safety-sensitive applications for example in the automotive industry), the ECC decoder itself may be implemented in a redundant form (i.e., in duplication). As can be understood and appreciated by the skilled person, such redundancy may be achieved in any suitable manner, such as by introducing physical separation, timing diversity (e.g., delay), or the like.

However, such redundancy itself may bring new challenges regarding die size, power consumption, common cause failure (CCF) mitigation mechanisms, etc.

In view thereof, broadly speaking, the focus of the present disclosure is to propose techniques and/or mechanisms for improvement of die size related hardware redundancy for ECC decoder circuits, and more particularly, to techniques and/or mechanisms for detecting faulty operation of the ECC decoder in an efficient, flexible, yet reliable manner.

SUMMARY

In view of some or all of the above technical problems, broadly speaking, the present disclosure generally provides a detection circuit for detecting faulty operation of an error correction code (ECC) decoder that is configured for diagnosing whether an error has occurred in input data to the ECC decoder, a system, a method for detecting faulty operation of an ECC decoder, a program, as well as a computer-readable storage medium, having the features of the respective independent claims.

According to an aspect of the disclosure, there is provided a detection circuit for detecting faulty operation (e.g., (erroneous) correction of error-free data, etc.) of an error correction code (ECC) decoder. As illustrated earlier, the ECC decoder may be generally configured for diagnosing whether an error (e.g., one-bit error, two-bit error, etc., depending on the implementation) has occurred in input data to the ECC decoder. In addition, the ECC decoder may be further configured for outputting an error detection signal (or in general, any signal indicating whether the ECC decoder has detected an error in the input data) indicative of whether the error has been detected and potentially corrected by the ECC decoder and output data based on the input data.

In some cases, the error in the input data may have been successfully identified/detected (e.g., indicated by the error detection signal), and at the same time may have also been corrected, thereby generating the corrected output data (which in an ideal case should correspond to the original error-free data). In some other possible cases, the error in the input data may have been successfully identified/detected (e.g., indicated by the error detection signal), but may not have been corrected, thereby generating the output data which contains the same error as the (erroneous) input data. In some other possible cases, no error in the input data may have been identified/detected (e.g., the error detection signal may indicate no error), however, the input data (which should be error-free) may have been erroneously corrected, thereby generating the output data which contains an error that has been erroneously introduced by the ECC decoder. As will become more apparent in view of the detailed description below, particularly the last scenario where the ECC decoder may erroneously modify the error-free input data without any indication (i.e., the error detection signal may indicate no error) may appear to be of potential risk or danger to some safety-sensitive or critical applications.

In particular, the detection circuit may comprise a first stage configured to generate a first check signal indicative of whether there is a mismatch between the input data and the output data of the ECC decoder. Such mismatch may be determined or detected by any suitable means, as will be understood and appreciated by the skilled person. In some possible (non-limiting) examples, the mismatch may be detected by comparing the input data to the output data, by using any usable hardware (e.g., in a digital or analog design) or software-based mechanisms. For instance, depending on various representations of the input and output data, the input data may be compared to the output data as a whole, bit by bit, byte by byte, etc., in a sequential manner, in a parallel manner, or the like. By generating the first check signal indicative of whether there is a mismatch between the input data and the output data of the ECC decoder, it may be determined whether the input data has been modified (regardless of by correction of an error or by erroneous modification) by the ECC decoder (or more specifically, by a sub-module/component/entity thereof).

In addition, the detection circuit may also comprise a second stage configured to generate a second check signal indicative of whether faulty operation of the ECC decoder has been detected based on the first check signal and the error detection signal of the ECC decoder. As can be understood and appreciated by the skilled person, such second check signal may be generated based on the first check signal and the error detection signal of the ECC decoder by any suitable means. For instance, in some possible non-limiting examples, the first check signal may be compared to the error detection signal generated by the ECC decoder to determine/detect a mismatch between these two (e.g., mismatch between whether a modification of the data is expected). It is to be noted that the term mismatch in the context at hand should be understood in a broad sense, i.e., not completely or purely based on the respective values of the first check signal and the error detection signal, but rather based on the underlying essence indicated by the values of the first check signal and the error detection signal. Namely, depending on implementations and/or requirements, the first check signal as well as the error detection signal of the ECC decoder may be generated to have different values. For instance, in some possible (non-limiting) examples, a value "0" (or the like, depending on implementations, e.g., hardware or software, analog or digital) of the first check signal may be generated so as to indicate that a mismatch between the input data and the output data of the ECC decoder has been identified or detected; while in some other possible (non-limiting) examples, such mismatch between the input data and the output data may be indicated by a value "1" (or the like). Analogous or similar considerations also apply to the error detection signal that is generated and output by the ECC decoder. Therefore, in the present case, the term mismatch between the first check signal and the error detection signal should be understood as whether the situation indicated by first check signal (whether the input data has been modified by the ECC decoder or not) matches with (or correspond to) the situation indicated by the error detection signal (whether the ECC decoder indicates that an error has been detected and potentially corrected by the ECC decoder). As an illustrative (non-limiting) example, in some possible implementations, a situation where the input data has been modified by the ECC decoder whilst no (valid) error detection signal has been generated (or in other words, the input data has been silently (and most likely erroneously) modified without any error detection notification) may be considered a mismatch (and in some cases, also a potential risk or danger to the overall circuit/system). Similarly, a scenario where a (correctable) error detection notification has been indicated whilst the output data appears to not have been modified by the ECC decoder (i.e., the input and output data are the same) may also be considered a potential mismatch. Certainly, depending on implementations and/or requirements, the second check signal indicative of whether faulty operation of the ECC decoder has been detected may be generated based on the first check signal and the error detection signal of the ECC decoder by any other suitable means (e.g., by using a (purely) hardware based technique, a (purely) software based technique, or a combination thereof), as can be understood and appreciated by the skilled person.

Configured as proposed above, broadly speaking, the present disclosure generally provides a simple circuit that seeks to ensure the correctness of corrected data. In particular, each data item going out from the ECC decoder is compared, so that it is even possible to detect the case of a correctable error notification but missing correction. More specifically, example embodiments of the present disclosure generally perform comparison irrespective of whether or not the ECC decoder has detected an error. One of the main reasons is that, even if the fault in the ECC decoder (or in a sub-module thereof) may be considered latent, the impact of not being able to correct the error (even in the case of a 1 bit error) may be fatal for some applications (e.g., automotive applications). Therefore, the proposed concept of the present disclosure is also considered an improvement from a safety point of view. Further, example embodiments of the present disclosure would generally also result in less die size overhead and/or power consumption compared to (conventional) fully redundant implementations, since at least some of the (sub-)modules of the ECC decoder (which would be required in a fully redundant implementation) may be omitted. Moreover, since the input and output data can be compared without the respective data being split and separately handled (which may be the case in conventional techniques), the die size may be reduced even further. Yet further, since the data output from the ECC decoder is not changed by the proposed techniques of the present disclosure, no adaptation would be necessary at the receiving side, thereby further contributing to the improvement of the efficiency and die size. In addition, CCF mitigation mechanisms could be relaxed due to diversity (i.e., a (separate/standalone) detection circuit as proposed in the present disclosure vs. a completely redundant ECC decoder in conventional techniques). Finally, it is also to be noted that the concept of the present disclosure is devised in such manner that it is generally not limited to any specific single ECC application (e.g., only applicable to ECC based sync bridges), but can generally be used whenever an ECC decoder is used (which may include, but is certainly not limited thereto, volatile/non-volatile memories, bus, sync bridges, internally in IPs, etc.), thereby improving the flexibility in terms of applicability of the present disclosure. In some embodiments, the first stage may be configured to generate the first check signal indicating that there is the mismatch between the input data and the output data of the ECC decoder if the input data is different from the output data. As can be understood from the above, the input data being different from the output data may be determined or detected by using any suitable means (e.g., hardware based, software based, or a combination thereof). Similarly, the first check signal may be implemented in any suitable form (e.g., a binary signal, a multi-value/level signal, a software-based indication, or the like), and/or may have any suitable value to indicate the mismatch between the input data and the output data of the ECC decoder.

In some embodiments, the mismatch between the input data and the output data of the ECC decoder may indicate that the input data has been modified by the ECC decoder. As has also been illustrated earlier, the modification may be an expected correction of an error in the input data; or an erroneous modification of an error-free (or sometimes also referred to as fault-free) data input. Depending on whether such modification is correctly notified or not, such an erroneous modification may be considered to be a risk or danger to the whole system.

In some embodiments, the second stage may be configured to generate the second check signal indicating that faulty operation of the ECC decoder has been detected if: the first check signal indicates that there is the mismatch between the input data and the output data of the ECC decoder while the error detection signal of the ECC decoder indicates that no error has been detected by the ECC decoder, or the first check signal indicates that there is no mismatch between the input data and the output data of the ECC decoder while the error detection signal of the ECC decoder indicates that the error has been detected by the ECC decoder. As can be understood from the above, the first alternative may generally be seen as relating to the case that the ECC decoder may somehow erroneously and silently (i.e., without proper notification) modify the input data (which may be error-free). On the other hand, the second alternative may generally be seen to relate to the case when a correction of (corrupted) input data by the ECC decoder is expected (i.e., indicated by the error detection signal from the ECC decoder), but, in fact, the correction has for some reason not been performed (for instance, the sub-module/ component responsible for error correction in the ECC decoder for some reason may be unable to perform the correction).

In some embodiments, the ECC decoder may comprise a data correction component configured for correcting the error detected by the ECC decoder. In particular, the second check signal generated by the second stage may indicate that the data correction component of the ECC decoder is faulty, if the first check signal indicates that there is the mismatch between the input data and the output data of the ECC decoder while the error detection signal of the ECC decoder indicates that no error has been detected by the ECC decoder. As noted above, such kind of "silent" modification (i.e., without proper notification) or (erroneous) correction may be considered to be a potentially severe risk or danger for some applications (e.g., applications that are safety-sensitive or of critical nature), so that it should be handled appropriately, preferably in an efficient, flexible yet reliable manner, which is indeed achieved by the example embodiments proposed in the present disclosure.

In some embodiments, the first stage may comprise a plurality of XOR gates that are configured to take respective parts of the input and output data of the ECC decoder as input. That is to say, depending on implementations and/or requirements, a suitable part/portion (e.g., a bit, a byte, a word) of the input data and the output data may be respectively fed, as inputs, to a respective XOR gate. Further, the first stage may also comprise an OR gate coupled (or suitably connected) to the plurality of XOR gates. In particular, the OR gate may be configured to generate the first check signal (of the first stage that is indicative of whether there is a mismatch between the input and output data) based on outputs of the plurality of XOR gates. For instance, in some cases, an output with a value of "1" or with a high potential (or any other suitable form) may be generated by the OR gate to indicate that there is a mismatch between the input and output data. It may be worthwhile to note that, such implementation of XOR gates in combination with an OR gate is merely provided as a non-limiting example. As can be understood and appreciated by the skilled person, any other suitable implementation may be adopted, as long as it is able to somehow generate an output indicative of an existence of a mismatch between the input and output data of the ECC decoder. For instance, in some possible cases, the XOR and OR gate combination may be substituted by an XNOR and AND gate combination. In some other possible cases, the XOR and OR gate combination (or the like) may be implemented in a (purely) software based solution.

In some embodiments, the input and output data may each be represented by a sequence of bits.

In such cases, a count of bits of the output data may equal a count of the plurality of XOR gates. In some embodiments, the generation of the first check signal may comprise bit-wise comparing the input data to the output data using the plurality of XOR gates. In other words, the input data may be compared to the output data in a bit-by-bit manner by using the XOR gates. As such, any mismatch/difference between any of a pair of respective bits in the input and output data may be identified/detected (i.e., may be flagged by the respective XOR gate, and eventually, by the OR gate).

In some embodiments, the second stage may comprise an XOR gate as well. In particular, the XOR gate of the second stage may be configured to generate the second check signal indicative of whether faulty operation of the ECC decoder has been detected based on the first check signal and the error detection signal of the ECC decoder. As can be understood and appreciated by the skilled person, a mismatch between (values of) the first check signal and the error detection signal of the ECC decoder, if any, may be identified/detected by using such XOR gate. Of course, it goes without saying that, similar to the above first stage, such XOR gate based second stage should be understood to merely represent one possible (non-limiting) example, and any other suitable implementation (e.g., purely software based solutions) may be used here as well.

In some embodiments, the detection circuit may further comprise a self-diagnosis module (entity/component) that is configured for testing whether the detection circuit itself is faulty. Thereby, an integrated build-in self-diagnosis function may be implemented as well. The self-test/diagnosis functionality may be considered to provide a benefit in some possible cases, for example to test the electronic component (for instance, the XOR and OR gates, e.g., against possible stuck-at faults) as well as error notification path (e.g., from the generated second check signal) to an error control module (ECM), an error processing module, an error management module, or the like. Of course, the self-test/diagnosis functionality should be understood to be an optional feature in the sense that it may only be included if necessary for the envisaged implementation.

In some embodiments, the self-diagnosis module may comprise at least one inverter configured for flipping one bit (or more) of the input data or the output data before input to the plurality of XOR gates. For instance, depending on implementations and/or requirements (e.g., a tradeoff between cost/size and testability), the self-diagnosis module may comprise one inverter (thereby being able to flip only one bit) or for example 32 (or any other suitable number) inverters (which is assumed to be equal to the bit width of the input/output data, thereby being able to flip all possible bits). In such cases, in some possible implementations, the self-test/diagnosis module may also comprise one or more selectors (or the like) that may be configured to select either the original (not-flipped/not-inverted) or flipped/inverted data bit(s), depending on circumstances and/or requirements. As such, particularly by introducing (intentional) flipping in some bit locations (in a controlled manner), the error signal notification path from the generated second check signal to a possible error processing/management module as well as the XOR and OR gates may be efficiently and effectively tested.

In some embodiments, the error in the input data may include an error involving at least one data bit. For instance, in some possible cases, the error may be a 1-bit error or a 2-bit error. Of course, as can also be understood and appreciated, whether the ECC decoder is capable of detecting an error of a specific number of bits, and additionally, whether the ECC decoder is capable of possibly correcting an error of a specific number of bits may depend on the implementation of the ECC decoder (e.g., at a tradeoff of between complexity and cost/size). Specifically, it may also be worthwhile to mention that an ECC decoder being able to detect an error of a specific number of bits (e.g., a 2-bit error) does not necessarily mean that the ECC decoder is also capable of possibly correcting the error of the specific number of bits (e.g., a 2-bit error). For instance, in some possible implementations, an ECC decoder may be able to detect both 1-bit error and 2-bit error (e.g., with 100% confidence/guarantee) but may only be able to correct a 1-bit error (e.g., with 100% confidence/guarantee).

In some embodiments, at least one of the first check signal or the second check signal may be a binary signal. Depending on implementations, such binary signal may for example be in the form of a numerical value "0" or "1", of a Boolean value "true" or "false", or the like. However, as has been noted above, any other suitable and possible form (e.g., a multi-level/value signal, a textual indication, a (purely) software-based indication, etc.) of the first and second check signal (and possibly also of the error detection signal generated by the ECC decoder) may be implemented, as can be understood and appreciated by the skilled person.

In some embodiments, the second check signal indicative of whether faulty operation of the ECC decoder has been detected may be output for further error processing. Such further error processing may be anything suitable, which may include, but is certainly not limited to, generating an interruption signal, performing a reset of one or more modules, performing a complete restart of the whole application/system, or the like. Moreover, as mentioned above, such further error processing may be performed by any suitable and possible error control module, error processing module, error management module, or the like.

According to another aspect of the present disclosure, there is provided a system. The system may comprise a transmitting module for transmitting input data. In some cases, the transmitting module may also be referred to as a transmitting device/component/entity, a transmitter, a sending module/device/entity, or the like. The input data may be error-free or may be corrupted along the transmission path due to any possible reason (e.g., transient or permanent).

The system may also comprise an ECC decoder. As illustrated above, the ECC decoder may be configured for diagnosing whether an error has occurred in the input data, and additionally, configured for outputting an error detection signal indicative of whether the error has been detected and potentially corrected by the ECC decoder, and output data based on the input data. Finally, the system may comprise a detection circuit for detecting faulty operation of the ECC decoder according to any one of example embodiments and aspects proposed throughout the present disclosure.

Configured as proposed above, the system may generally be able to ensure the correctness of corrected data. At the same time, less die size overhead and/or power consumption compared to (conventional) fully redundant implementations can be achieved. In addition, CCF mitigation mechanisms can be relaxed due to diversity (i.e., a (separate/standalone) detection circuit as proposed in the present disclosure vs. a completely redundant ECC in conventional techniques). Finally, it is also to be noted that the concept of the present disclosure is generally not limited to any specific single ECC application (e.g., only applicable to ECC based sync bridges), but can generally be used whenever an ECC decoder is used (which may include, but is certainly not limited thereto, volatile/non-volatile memories, bus, sync bridges, internally in Ips, etc.), thereby improving flexibility in terms of applicability of techniques of the present disclosure.

In some embodiments, the transmitting module may relate to a memory. For example, the memory may be a volatile or a non-volatile memory, such as a static random access memory (static RAM or SRAM) or the like. As illustrated above, the present disclosure is not limited to any specific ECC application, and thus, any other suitable transmitting module may be possibly used, depending on implementations. In some possible cases, the transmitting module may also be a (purely) software based implementation, i.e., implemented entirely in software.

In some possible cases, the system may also comprise a suitable error control module, error processing module, error management module, or the like, that is configured to perform any suitable error correction/processing/management based on the second check signal that is generated and output by the detection circuit.

According to another aspect of the present disclosure, there is provided a method for detecting faulty operation of an ECC decoder. As illustrated above, the ECC decoder may be configured for diagnosing whether an error has occurred in the input data, and additionally, configured for outputting an error detection signal indicative of whether the error has been detected and potentially corrected by the ECC decoder and output data based on the input data.

In particular, the method may comprise generating a first check signal indicative of whether there is a mismatch between the input data and the output data of the ECC decoder. The method may further comprise generating a second check signal indicative of whether faulty operation of the ECC decoder has been detected based on the first check signal and the error detection signal of the ECC decoder.

Configured as proposed above, broadly speaking, the present disclosure generally provides a method that seeks to ensure the correctness of corrected data. In particular, each data going into and out from ECC is compared, so that it is even possible to detect the case of correctable error notification but missing correction. More specifically, example embodiments of the present disclosure generally perform comparison irrespective of whether or not the ECC decoder has detected an error. One of the main reasons is that, even if the fault in ECC (or in a sub-module thereof) may be considered latent, the impact of not being able to correct the error (even in the case of a 1-bit error) may be fatal for some applications. Therefore, the proposed concept of the present disclosure is also considered an improvement from a safety point of view. Further, example embodiments of the present disclosure would generally also result in less die size overhead and/or power consumption compared to (conventional) fully redundant implementations, since at least some of the modules (or sub-modules) of the ECC decoder (which would be required in a fully redundant implementation) may be omitted. Moreover, since the input and output data can be compared without the respective data being split and separately handled (which is adopted in some conventional techniques), the die size may be reduced even further. Yet further, since the data output from the ECC is not changed by the proposed techniques of the present disclosure, no adaptation would be necessary at the receiving side/end, thereby further contributing to the improvement of the efficiency and die size. In addition, CCF mitigation mechanisms could be relaxed due to diversity (i.e., a (separate/standalone) detection circuit as proposed in the present disclosure vs. a completely redundant ECC decoder in some conventional techniques). Finally, it is also to be noted that the concept of the present disclosure is devised in such manner that it is generally not limited to any specific single ECC application (e.g., only applicable to ECC based sync bridges), but can generally be used whenever an ECC decoder is used (which may include, but is certainly not limited thereto, volatile/non-volatile memories, bus, sync bridges, internally in Ips, etc.), thereby improving the flexibility in terms of applicability of techniques according to the present disclosure.

In some embodiments, the second check signal may be generated to indicate that faulty operation of the ECC decoder has been detected, if there is the mismatch between the input data and the output data of the ECC decoder while the error detection signal of the ECC decoder indicates that no error has been detected by the ECC decoder, or if there is no mismatch between the input data and the output data of the ECC decoder while the error detection signal of the ECC decoder indicates that the error has been detected by the ECC decoder.

In some embodiments, the ECC decoder may comprise a data correction component configured for correcting the error detected by the ECC decoder. In particular, the method may further comprise, if there is the mismatch between the input data and the output data of the ECC decoder while the error detection signal of the ECC decoder indicates that no error has been detected by the ECC decoder, determining that the data correction component of the ECC decoder is faulty.

According to a further aspect of the present invention, a computer program is provided. The computer program may include instructions that, when executed by a processor, cause the processor to carry out all steps of the example methods described throughout the present disclosure.

According to yet a further aspect of the present invention, a computer-readable storage medium is provided. The computer-readable storage medium may store the aforementioned computer program.

Details of the disclosed method can be implemented as systems (e.g., in the form of circuitry) adapted to execute some or all of the steps of the method, and vice versa, as the skilled person will appreciate. In particular, it is understood that methods according to the disclosure relate to methods of operating the systems (or circuitry) according to the above embodiments and variations thereof and that respective statements made with regard to the systems (or circuitry) likewise apply to the corresponding methods, and vice versa.

It is also understood that in the present document, the term "couple" or "coupled" refers to elements being in electrical communication with each other, whether directly connected e.g., via wires or in some other manner (e.g., indirectly). Notably, one example of being coupled is being connected.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates an example of a possible implementation of an ECC decoder, FIG. 2 schematically illustrates an example of a detection circuit for detecting faulty operation of an ECC decoder according to embodiments of the present disclosure, FIG. 3 schematically illustrates another example of a detection circuit for detecting faulty operation of an ECC decoder according to embodiments of the present disclosure.

DETAILED DESCRIPTION

As indicated above, identical or like reference numbers in the present disclosure may, unless indicated otherwise, indicate identical or like elements, such that repeated description thereof may be omitted for reasons of conciseness.

As can be understood and appreciated by the skilled person, conventionally speaking, techniques related to error correction (or correcting) code are widely used, e.g., in the technical fields of computing, telecommunication, automotive, etc., for controlling (e.g., detecting, correcting, etc.) errors in data transmitted over unreliable or noisy communication channels. Thus, generally speaking, the ECC may be considered an active (in the sense that it can change/correct the error/fault) safety mechanism.

However, also due to its "active" nature, in some possible cases, the ECC decoder may perform a wrong correction, i.e., correction at a wrong bit location. In some other possible cases, the ECC decoder may perform a correction while it shall not be (i.e., when this is no data corruption).

Moreover, in some further possible cases, the ECC decoder may also notify a correctable error without being able to correct such error.

Thus, in many implementations (particularly in those relating to safety-sensitive applications for example in the automotive industry), the ECC decoder itself may be implemented in a redundant form (i.e., in duplication). As can be understood and appreciated by the skilled person, such redundancy may be achieved in any suitable manner, such as by introducing physical separation, timing diversity (e.g., delay), or the like.

However, such redundancy may itself bring several challenges regarding die size, power consumption, common cause failure (CCF) mitigation mechanisms, etc.

In view thereof, in a broad sense, the present disclosure generally proposes techniques for improvement of die size related hardware redundancy for ECC decoder circuits, and more particularly, techniques and/or mechanisms for detecting faulty operation of the ECC decoder, in an efficient, flexible, yet reliable manner. Broadly speaking, this is achieved by introducing a detection circuit (and a corresponding method) that is capable of detecting a mismatch between the error notification behavior and the error correction behavior of the ECC decoder, thereby identifying potential faulty operation in the ECC decoder. Specifically, at least one of the targets of the present disclosure is, as will be discussed in more detail below, addressing a potential risky/dangerous issue related to a "silent" correction behavior of the ECC decoder, where the ECC decoder (unexpectedly or erroneously) modifies a (possibly error-free) data input but without generating any error detection notification/indication.

Figure 1:
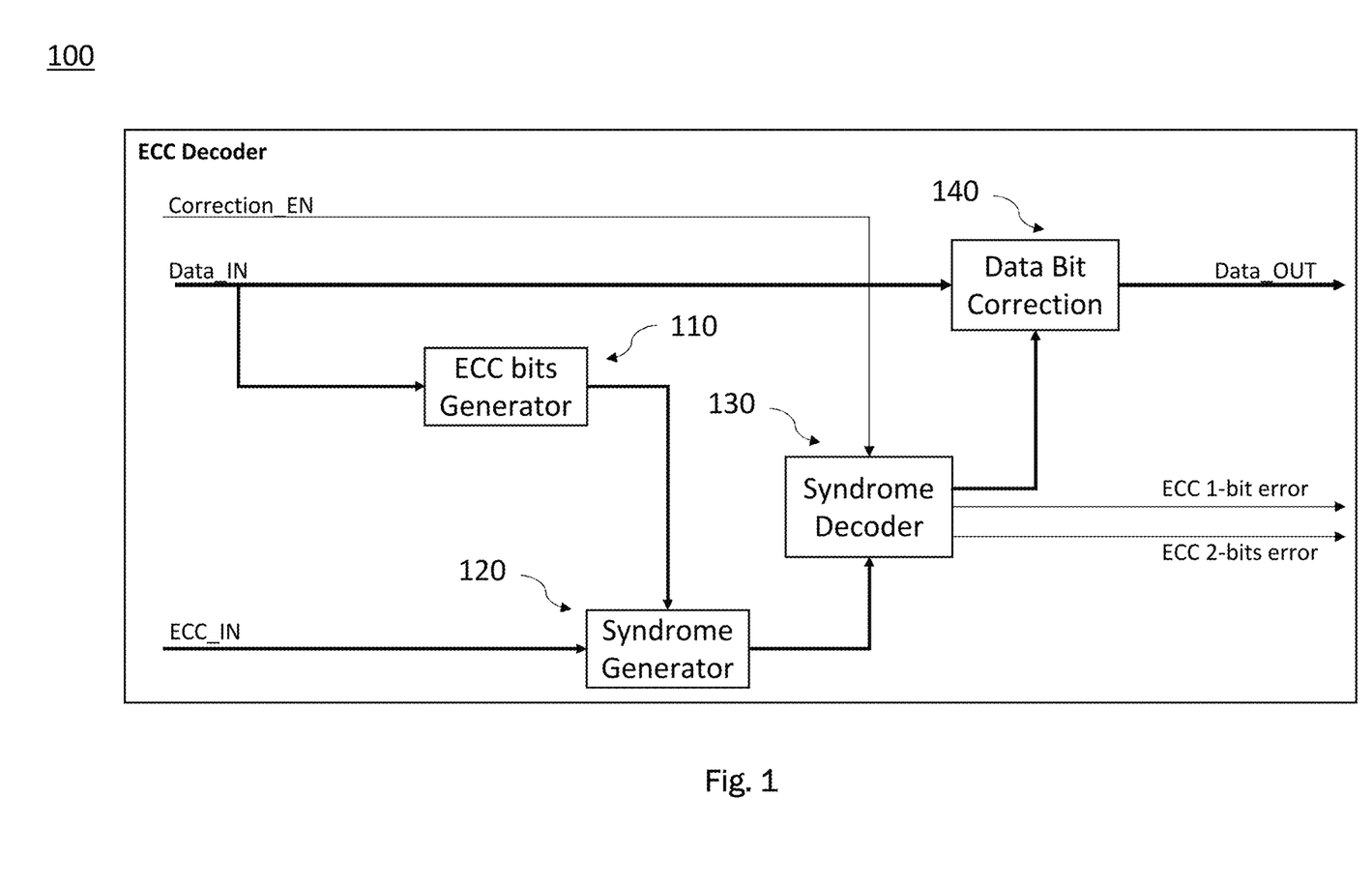

Before going into detail of possible example embodiments of the present disclosure, it may be worthwhile to first give a brief introduction for a working principle of a possible implementation of an ECC decoder 100 as exemplarily shown in FIG. 1. Of course, any other suitable design for an ECC decoder may be feasible as well and may deviate from the example of FIG. 1, depending on implementations.

In particular, in the example of FIG. 1 the check bits may be computed from the input data Data_IN by the check bit generator block 110. In some possible examples, the input data may be of 32 (or any other suitable number) bit length/width, and the check bits (sometimes also referred to as ECC check bits) may be of 7 (or any other suitable number) bit length/width. The check bits may be XORed with the ECC_IN inputs to form the error syndrome in the syndrome generator 120. If all bits of the syndrome are 0 (e.g., as determined by the syndrome decoder block 130), then this generally means that there is no error (recomputed check bits are the same as ECC_IN inputs). If one or more syndrome bits are 1 (e.g., as determined by the syndrome decoder block 130), then this generally means that an error is detected as indicated by the output ECC 1-bit error=1. If the error is not correctable (e.g., when a 2-bit error has been detected however only 1-bit errors are correctable in the example ECC decoder of FIG. 1), then the output ECC 2-bits error=1 is generated.

When correction is enabled (e.g., indicated by the Correction_EN signal) and a correctable error is detected (e.g., indicated by ECC 1-bit error=1 and ECC 2-bits error=0), the data bit in error may be corrected for example by the data bit correction block 140 as it passes from Data_IN to Data_OUT. If the error is not correctable (indicated by ECC 2-bits error=1), data may pass unchanged from Data_IN to Data_OUT. Notably, in some possible designs/implementations, the ECC decoder may be extended to include one or more additional (optional) blocks (not shown in FIG. 1), for example for debug purposes, or to include additional signals to be used as an ECC encoder as well, etc., as can be understood and appreciated by the skilled person.

Now, depending on whether the data input (i.e., Data_IN input as exemplarily shown in FIG. 1) and/or the ECC check bit input (i.e., ECC_IN input as exemplarily shown in FIG. 1) is faulty (e.g., the data/ECC bits are corrupted when they are read out from the memory or the like) or fault free (e.g., the data/ECC bits are not corrupted), faulty operation in or of a different element of the ECC decoder 100 (e.g., the check bit generator block 110, the syndrome generator 120, the syndrome decoder block 130, the data bit correction block 140, etc.) may lead to different error modes, and in consequence, may have different impact. Such analysis will now be summarized in the below Table 1 to Table 4 illustrative references. As can be understood and appreciated by the skilled person, in some possible cases, this may also be referred to as a high-level conceptual failure mode, effect, and diagnostic analysis (CFMEDA) or simply FMEDA.

First, Table 1 schematically illustrates a scenario where the check bit generator block 110 of the ECC decoder 100 may be faulty.

TABLE 1

| | | Block Check Bit Generator is faulty | | |
|---|---|---|---|---|
| Data_IN | ECC_IN | Failure mode | Impact | Type |
| Fault-free | Fault-free | Wrong check Bit computation (which, in some possible cases, may also include no output, stuck-at related failure) | Wrong syndrome generation and thus possible correction of fault-free data | DVF |
| Fault-free | Faulty | | Wrong syndrome generation. Consequently, a possible correction of fault-free data. However, double faults are required (ECC_IN and Check Bit generator) Therefore, the fault in check bit generator is to be classified as IVF | IVF |
| Faulty | Fault-free | | Wrong syndrome generation. Consequently, a possible wrong (bit) correction of faulty data. However, double faults are required (Data_IN and Check Bit generator) Therefore, the fault in check bit generator is to be classified as IVF | IVF |

Notably, as used herein, the term DVF generally stands for direct violation fault that is used within the context of the present disclosure to refer to a fault category that can be assigned to a fault that categorizes the fault as one which, in the absence of any safety mechanism, has the potential to directly violate a safety goal. On the other hand, the term IVF generally stands for indirect violation fault that is used within the context of the present disclosure to refer to a fault category which can be assigned to a fault that categorizes the fault as one which, only in combination with one or more other faults, has the potential to violate a safety goal.

Table 2 schematically illustrates a scenario where the syndrome generator block 120 of the ECC decoder 100 may be faulty.

TABLE 2

| | | Block Syndrome Generator is faulty | | |
|---|---|---|---|---|
| Data_IN | ECC_IN | Failure mode | Impact | Type |
| Fault-free | Fault-free | Wrong syndrome generation (which, in some possible cases, may also include no output, stuck-at related failure) | Wrong syndrome generation and thus possible correction of fault-free data @syndrome decoder | DVF |
| Fault-free | Faulty | | Wrong syndrome generation. Consequently, a possible correction of fault-free data. However, double faults are required (syndrome generator and ECC_IN bit(s)) | IVF |

TABLE 2-continued

Block Syndrome Generator is faulty

| Data_IN | ECC_IN | Failure mode | Impact | Type |
|---|---|---|---|---|
| Faulty | Fault-free | | Wrong syndrome generation. Consequently, a possible correction of faulty data. However, double faults are required (syndrome generator and Data_IN bit(s)) | IVF |

Table 3 schematically illustrates a scenario where the syndrome decoder block 130 of the ECC decoder 100 may be faulty.

TABLE 3

Block Syndrome Decoder is faulty

| Data_IN | ECC_IN | Failure mode | Impact | Type |
|---|---|---|---|---|
| Fault-free | Fault-free | Wrong syndrome decoded | Wrong syndrome decoded and thus possible correction of fault-free data @syndrome decoder | DVF |
| Fault-free | Faulty | (which, in some possible cases, may also include no output, stuck-at related failure) | Wrong syndrome decoded. Consequently, a possible correction of fault-free data. However, double faults are required (syndrome decoder and ECC_IN bit(s)) | IVF |
| Faulty | Fault-free | | Wrong syndrome decoded. Consequently, a possible correction of faulty data. However, double faults are required (syndrome decoder and Data_IN bit(s)) | IVF |

Table 4 schematically illustrates a scenario where the data bit correction block 140 of the ECC decoder 100 may be faulty.

TABLE 4

Block Data Bit Correction is faulty

| Data_IN | ECC_IN | Failure mode | Impact | Type |
|---|---|---|---|---|
| Fault-free | Fault-free | Wrong bit correction (which, in some possible cases, may also include correction of wrong bit, or even multi-bits or no correction when it shall be done) | Correction of fault-free data @Bit correction (no notification) | DVF |
| Fault-free | Faulty | | Possible correction of fault-free data but notified by ECC 1-bit error or ECC 2-bits error | DVF |
| Faulty | Fault-free | | Possible correction of faulty data but notified by ECC 1-bit error or ECC 2-bits error | DVF |

As can be seen and understood from the above analysis summarized in Table 1 to Table 4, errors/faults/failures with respect to the first three tables (i.e., faulty operation in the check bit generator block 110, the syndrome generator 120, or the syndrome decoder block 130 of the ECC decoder 100 in the example of FIG. 1) appear to always have proper error notifications (e.g., indicated by the ECC 1-bit error signal), even if, in some possible cases, such error notifications may be "fake" (viz., false alarms/notifications). From a safety perspective, such notifications of error (even if "fake" per se) may be considered beneficial, as the application/system may attempt to respond accordingly (e.g., reset or restart) to resolve any potential error.

On the other hand, an error/failure in the data bit correction block 140 of the ECC decoder 100 in the example of FIG. 1 (Table 4) may result in a "silent" modification without any error notification. As has already been emphasized above, such kind of "silent" (i.e., without proper notification) modification or (erroneous) correction may be considered to be a potential severe risk or danger for some applications (e.g., applications that are safety-sensitive or of critical nature).

Therefore, at least one of the main targets of the present disclosure is to address such potential risky/dangerous issue related to a "silent" correction behavior of the ECC decoder (or more specifically, of the data bit correction block within the ECC decoder, for example), where the ECC decoder unexpectedly or erroneously modifies a (possibly error-free) data input, but does so without generating any error detection notification/indication. This will be discussed now in more detail with reference to the illustrative (non-limiting) example of FIG. 2.

Figure 2:
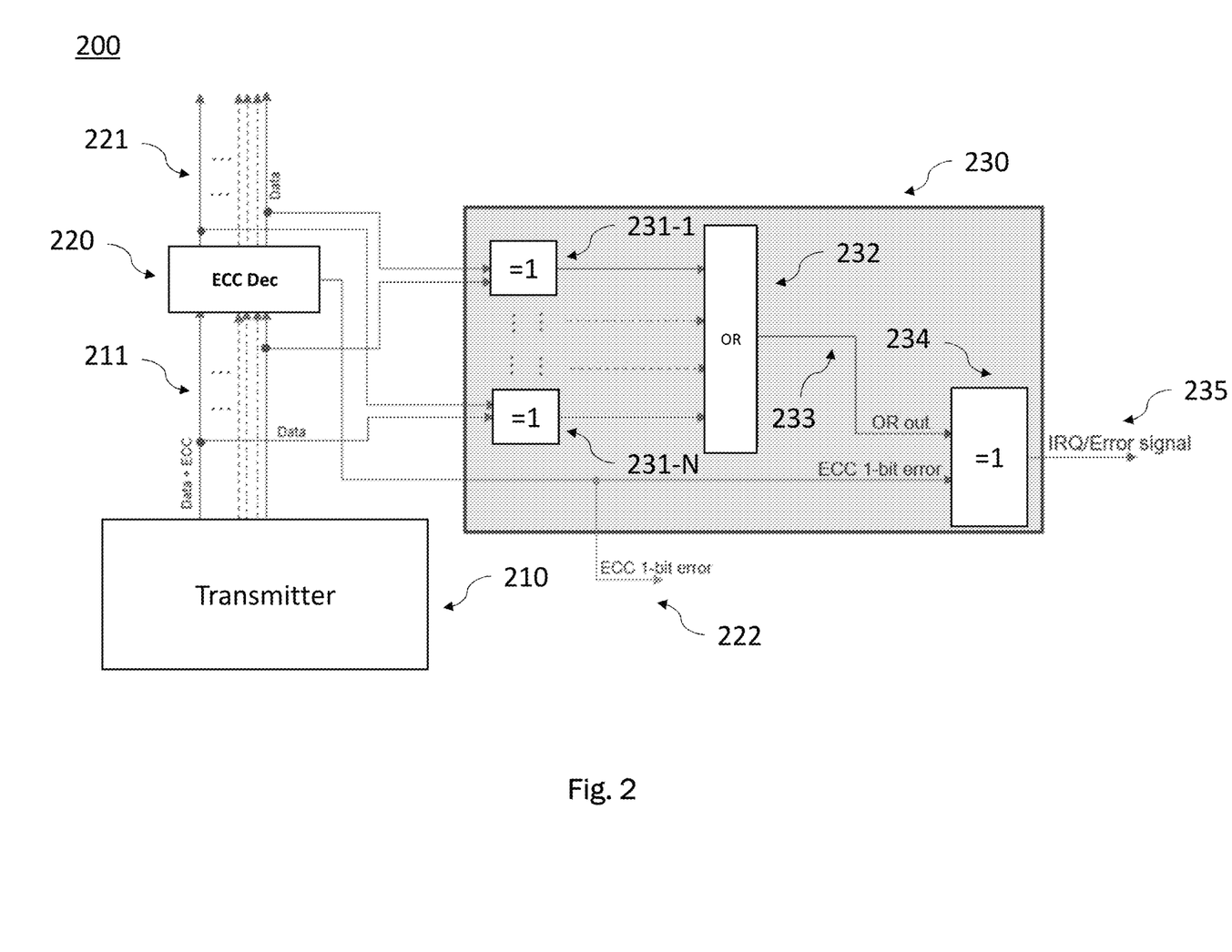

Particularly, as shown in the example system 200 of FIG. 2, a transmitter (or sometimes also referred to as a transmitting side/end device or entity) 210 is provided that is configured to output (e.g., in response to an instruction/command) a data input for the ECC decoder 220. For instance, in some possible examples, the transmitter 210 may relate to a memory (e.g., an SRAM or the like) that is configured to, on receipt of a read instruction/command (e.g., from a central processing unit (CPU)) to output the respective data. The data input of the ECC decoder 220 (i.e., that is output/transmitted from the transmitter 210) may comprise a data portion as well as an ECC check bit portion. In some possible implementations, the data may have a bit length or width of 32 (or the like), while the ECC check bits may have a bit length or width of 7. As illustrated above, the ECC decoder 220 may be configured to, depending on implementations, generate (among others) a data output 221 and an error detection indication/notification signal 222 based on the input 211. The data output 221 may be transmitted to and received by any suitable receiver or receiving side/end device or entity, such as a CPU or the like. The basic working principle of the ECC decoder 220 may be analogous or similar to the ECC decoder 100 as described with respect to FIG. 1, and is thus not repeated for the sake of conciseness.

Now, in order to identify or detect possible faulty operation of the ECC decoder 220 (or more specifically, to detect possible faulty operation related to silent modification of the data bit correction thereof), the present disclosure proposes a detection circuit (e.g., detection circuit 230 in FIG. 2).

To be more specific, in the example of FIG. 2, detection circuit 230 may comprise a plurality of XOR gates 231-1-231-N, where the number N may equal the bit width or length (e.g., 32) of the input/output data. Configured as such, the data going into (211) and coming out (221) of ECC decoder 220 may be (bit-wise) compared to each other (i.e., in the present example, XOR-ed).

The outputs of the respective (bit-wise) comparison may then be fed into an OR gate 232 such that, in case of a mismatch between the input and output data (e.g., 1 bit has been corrected by the ECC decoder), the output of the OR gate 233 (the claimed first check signal) would exhibit for example a "1" or "high potential" (or the like). Moreover, since the ECC decoder has modified the input data, it is generally expected (in the case of an error/fault-free ECC decoder) that the error would be notified by the ECC decoder 220.

Therefore, in case no error is notified by the error detection signal 222 output from the ECC decoder 220, then most likely the ECC decoder (or more specifically, the data bit correction block) may be faulty. This generally corresponds to the case as exemplarily shown in the third row of Table 5 below. As a result, this would be detected or identified by an XOR-gate 234 and indicated by the IRQ/Error signal 235 (the claimed second check signal) going out from the XOR-gate 234.

That is to say, in case the output from the final XOR gate 234 is "1" or the like (which generally means that either correction is done but not notified, or an error is notified but correction is not performed), an error signal 235 will be generated, and depending on implementations, would possibly be propagated to any suitable error processing/management module (e.g., an interrupt controller, an ECM, or the like) for further (error) processing or management, which may include (but is certainly not limited to) reset, restart, completely shut down, or the like.

Notably, in some possible cases where the ECC 1-bit error 222 is signaled by the ECC decoder 220 but no error is indicated at the output of the XOR gate 234, this may generally mean that a correction of (corrupted) input data 211 by the ECC decoder 220 is expected (i.e., error signal 222 from ECC decoder is active), but is in fact not performed (e.g., the data bit correction block may be for some reason unable to correct). This generally corresponds to the case as exemplarily shown in the second row of Table 5 below. In that case, the proposed circuit would notify an error 235 as well.

For ease of understanding and reference, Table 5 as shown below generally summarizes possible combinations for the outputs of the respective blocks/entities and how the combinations could be interpreted.

TABLE 5

Possible outputs from respective blocks and interpretations therefor

| XOR 231 output | OR 232 output | ECC 1-bit error 222 | DVF error (XOR 234 output) | Interpretation |
| --- | --- | --- | --- | --- |
| All 0 | 0 | 0 | 0 | No error in data |
| All 0 | 0 | 1 | 1 | Correction is expected but not done |
| At least 1 | 1 | 0 | 1 | Error in the Data Bit Correction Block |
| At least 1 | 1 | 1 | 0 | Error in data detected and corrected |

It may be further worthwhile to mention that in some possible cases where there may be a fault in one of the ECC blocks except the data bit correction block (e.g., there is an error in the check bit generator block, the syndrome generator block, or the syndrome decoder block) which would then lead to a (wrong) correction and error signal notification by the ECC decoder, a so-called read-verify-check may be additionally performed. In some possible cases, the read-verify-check may involve reading (e.g., via a suitable software or the like) 0xAA . . . A, 0x55 . . . 5 from a known memory location and checking whether the error is notified again. If yes, then it might be possible to determine that one of the blocks of the ECC decoder except for the data bit correction block (e.g., the check bit generator block, the syndrome generator block, or the syndrome decoder block) may be faulty.

One of the reasons for the read-verify-check is that it may generally be difficult to distinguish between the following cases:

1) Input data is corrupted and the ECC decoder behaves correctly (i.e., no failure in any of the ECC decoder blocks), which is generally the normal case; and
2) Input data is fault-free but one of the ECC decoder blocks except for the data bit correction block has a failure. Specifically, this failure might lead to correction and an error notification but could not be detected by the proposed detection circuit 230.

Particularly, both the above possible cases may appear to lead to the same situation as exemplarily shown in the last row of Table 5.

Thus, it may be proposed to use the read-verify-check, which may be generally considered a complementary solution for the proposed detection circuit 230. For instance, in some possible implementations, it may be possible to just count the number of notified errors by the ECC decoder within a specific time interval (or in other words, check the rate of error notification).

One of the reasons for such rate checking is that, in cases of a potential fault or failure in one of the aforementioned blocks (e.g., the check bit generator block, the syndrome generator block, or the syndrome decoder block) of the ECC decoder, each read access may lead to a wrong "check bit", wrong "syndrome" and/or "wrong syndrome decoding". Therefore, by counting the rate, it may be an option to determine or set a corresponding error rate threshold and take proper actions accordingly, as can be understood and appreciated by the skilled person.

It may be nevertheless worthwhile to highlight again that although any other suitable error detection/management mechanisms may be possible, the main focus of the proposed example embodiments of the present disclosure relating to the detection circuit (or the like) lies in the data bit correction block of the ECC decoder, at least for reasons that a user may generally have no feasible mean to detect silent (wrong) correction, as no error notification would be signaled at that block. On the other hand, failures in other blocks of the ECC decoder may be perceived, as there would be always an error signaling from the ECC decoder, so that the user may still have the chance to verify (even in cases of a "fake" or "false" error notification) the behavior of the ECC decoder (e.g., by read-verify-check, rate counting, or any other suitable mechanism such as self-test of the ECC decoder, etc.).

It is to be noted that, as indicated above, the XOR gate and OR gate based implementation for the detection circuit 230 as shown in FIG. 2 is merely provided as a possible illustrative example, but is certainly not to be understood as a limitation of any kind. As can be understood and appreciated by the skilled person, any other suitable implementation may be adopted, as long as it is able to somehow detect and generate an output (the claimed first check signal) indicative of an existence of a mismatch between the input and output data of the ECC decoder for example at a first stage of the ECC fault detection circuit (e.g., indicated by the output 233 of the OR gate 232 in the example of FIG. 2); and in addition, to detect and generate a further output (the claimed second check signal) indicative of an existence of a further mismatch between the first check signal and the error detection signal of the ECC decoder (e.g., indicated by the output 235 of the XOR gate 234 in the example of FIG. 2). For instance, in some possible cases, the XOR and OR gate combination may be substituted by an XNOR and AND gate combination. In some other possible cases, the XOR and OR gate combination (or the like) of the first stage and/or the XOR gate in the second stage may be implemented in a (purely) software based solution.

To summarize the above, particularly by being configured as proposed above, the present disclosure generally provides a simple detection circuit that seeks to ensure the correctness of corrected data. In particular, each data going out from the ECC decoder is compared to a corresponding input, so that it is even possible to detect the case of correctable error but missing correction. More specifically, example embodiments of the present disclosure generally perform comparison irrespective of whether or not the ECC decoder has detected an error (or notifies an error). One of the main reasons is that, even if the fault in ECC (or in a sub-module thereof) may be considered latent, the impact of not being able to correct the error (even in the case of a 1 bit error) may be fatal for some applications (e.g., automotive applications). Therefore, the proposed concept of the present disclosure is also considered an improvement from a safety point of view.

Further, example embodiments of the present disclosure would generally also result in less die size overhead and/or power consumption compared to (conventional) fully redundant implementations, since at least some of the modules or submodules of the ECC decoder (that would be required in a full redundant implementation) may be omitted. Moreover, since the input and output data can be compared without the respective data being split and separately handled (which is adopted in conventional techniques), the die size may be reduced even further. Yet further, since the data output from the ECC decoder is not changed by the proposed techniques of the present disclosure, no adaptation would be necessary at the receiving side/end, thereby further contributing to the improvement of the efficiency and die size. In addition, CCF mitigation mechanisms could be relaxed due to diversity (i.e., a (separate/standalone) detection circuit as proposed in the present disclosure vs. a completely redundant ECC decoder in some conventional techniques). Finally, it is also to be noted that, as can be understood and appreciated by the skilled person, the concept of the present disclosure is proposed in such a manner that it is generally not limited to any specific single ECC application (e.g., only applicable to ECC based sync bridges), but can generally be used whenever an ECC decoder is used (which may include, but is certainly not limited thereto, volatile/non-volatile memories, bus, sync bridges, internally in Ips, etc.), thereby improving the flexibility in terms of applicability of the present disclosure.

Moreover, the proposed detection circuit may be further developed or enhanced to be equipped with a self-diagnosis function, that may be configured to for example test the circuit as well as the connection to a central error processing management module (not shown in the figures). A possible example of such an implementation with self-diagnosis functionality is shown in FIG. 3.

Figure 3:
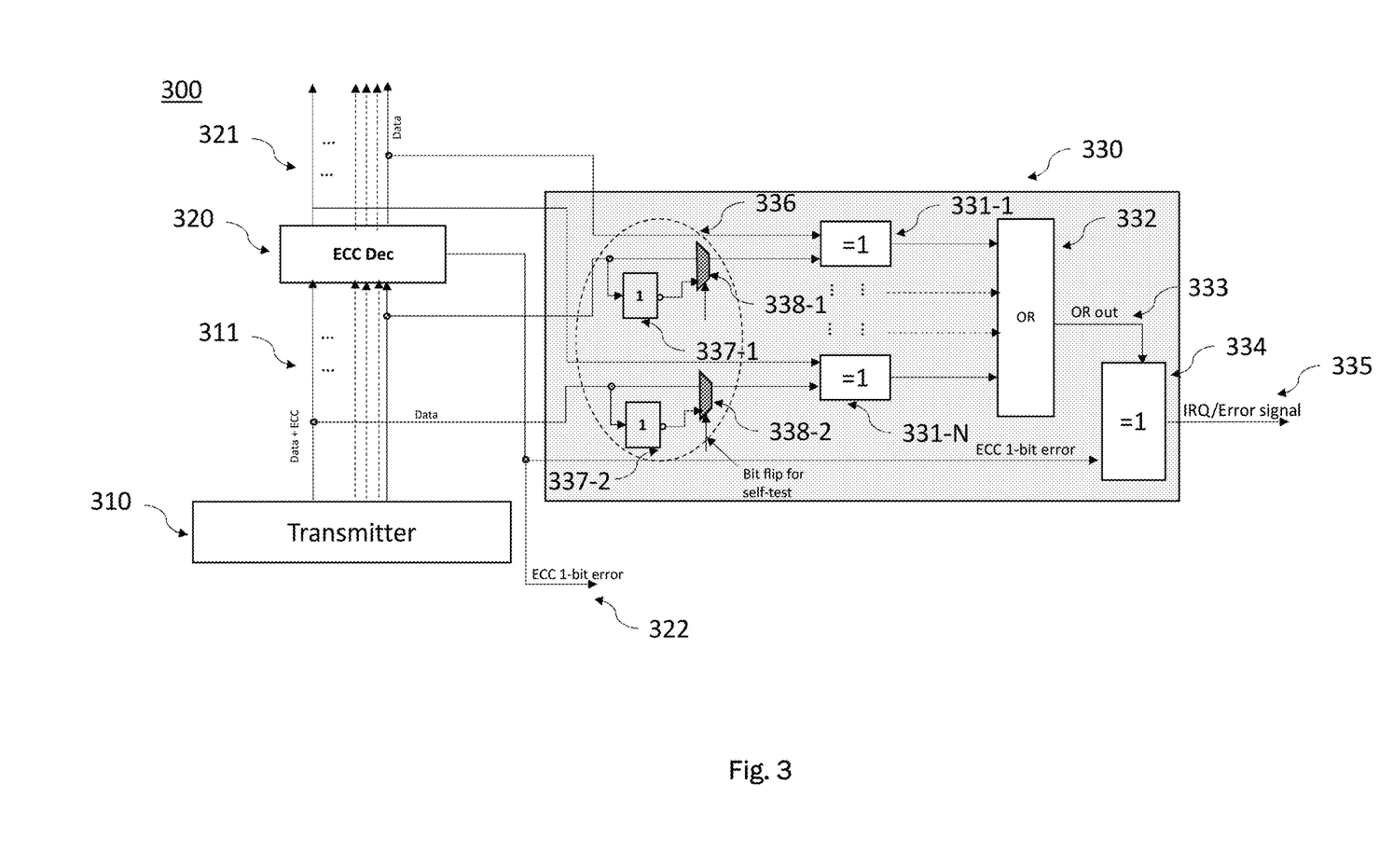

It is to be noted that identical or like reference numbers in the example of FIG. 3 may, unless indicated otherwise, relate to elements identical or similar to those in the example of FIG. 2, such that repeated description thereof may be omitted for reasons of conciseness.

In particular, the detection circuit 330 as shown in FIG. 3 may comprise, in addition to those blocks described above with reference to FIG. 2, a self-diagnosis function block 336.

To be more specific, in some possible implementations, the self-diagnosis function block 336 may comprise one or more inverters (as exemplarily indicated by reference signs 337-1 and 337-2 in the present example). Thereby, one or more bits of the input and/or output data provided to the detection circuit 330 may be (intentionally) flipped, particularly in a controlled manner. It is to be noted that, although in the example of FIG. 3, the inverters 337-1 and 337-2 may seem to be both coupled to the input data bits 331, in some possible cases, one or more inverters may additionally or alternatively couple to one or more bits of the output data 321 as well, as can be understood and appreciated by the skilled person. Moreover, the self-diagnosis function block 336 may also comprise one or more selectors (as indicated by reference signs 338-1 and 338-2 in the present example) that are configured to select whether the original (not-flipped) data bit(s) or the flipped data bit(s) should be fed into the respective XOR gates 331-1 . . . 331-N, depending on circumstances and/or requirements. As can also be understood and appreciated by the skilled person, the number of inverters as well as of the corresponding selectors may be determined depending on implementations and/or requirements, for example as a tradeoff between cost and testability. Configured as such, the XOR comparators 331 may detect a mismatch (between the input and output data that is caused by the intentional flipping of one or more bits) and issue an IRQ/Error signal 335 for example to an error management module (similar to the scenario where the ECC decoder silently and erroneously modifies the data without any error notification, which corresponds to the third row in Table 5).

With the above configuration, it is thus possible to implement self-testing functionality for testing the detection circuit itself (and the signal path to the error processing/management module), in an efficient and flexible manner.

Finally, a flowchart illustrating an example of a method 300 for detecting faulty operation of an error correction code (ECC) decoder is schematically shown in FIG. 3. As illustrated above, the ECC decoder may be configured for diagnosing whether an error has occurred in the input data, and additionally, configured for outputting an error detection signal indicative of whether the error has been detected and potentially corrected by the ECC decoder and for outputting output data based on the input data. The ECC decoder may be implemented as the ECC decoder 100 in FIG. 1, the ECC decoder 220 in FIG. 2, the ECC decoder 320 in FIG. 3, or the like, for example.

Figure 4:
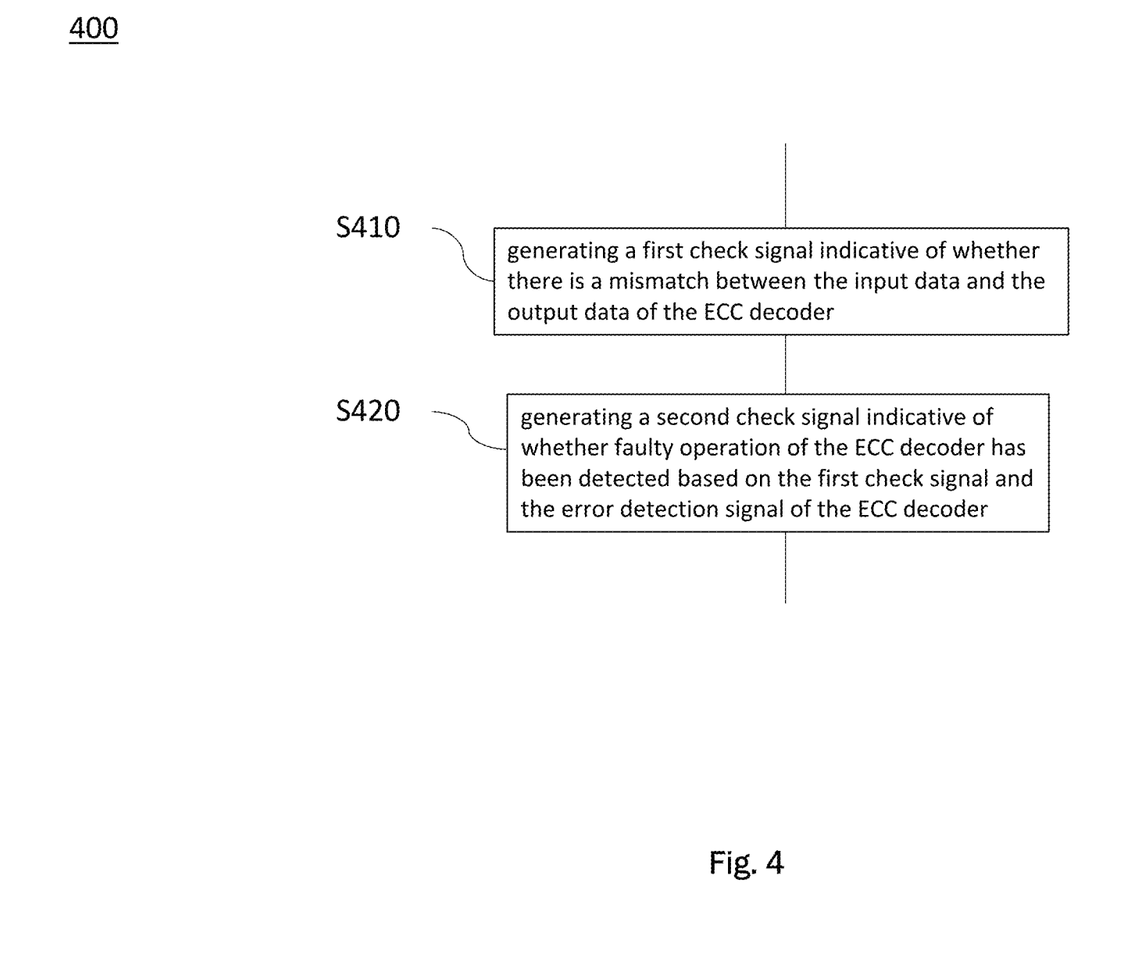
FIG. 4 is a flowchart schematically illustrating an example of a method for detecting faulty operation of an ECC decoder according to embodiments of the present disclosure.

In particular, method 400 may comprise, at step S410, generating a first check signal indicative of whether there is a mismatch between the input data and the output data of the ECC decoder.

Method 400 may further comprise, at step S420, generating a second check signal indicative of whether faulty operation of the ECC decoder has been detected based on the first check signal and the error detection signal of the ECC decoder.

Configured as proposed above, the method proposed by the present disclosure seeks to ensure the correctness of corrected data. In particular, each data going into and out from ECC decoder is compared, so that it is even possible to detect the case of correctable error notification but missing correction. More specifically, example embodiments of the present disclosure generally perform comparison irrespective of whether or not the ECC decoder has detected an error. One of the main reasons is that, even if the fault in ECC decoder (or in a sub-module thereof) may be considered latent, the impact of not being able to correct the error (even in the case of a 1-bit error) may be fatal for some applications (e.g., automotive applications). Therefore, the proposed concept of the present disclosure is also considered an improvement from a safety point of view.

Further, example embodiments of the present disclosure would generally also result in less die size overhead and/or power consumption compared to (conventional) fully redundant implementations, since at least some of the modules or submodules of the ECC (which would be required in a fully redundant implementation) may be omitted. Moreover, since the input and output data can be compared without the respective data being split and separately handled (which is adopted in conventional techniques), the die size may be reduced even further. Yet further, since the data output from the ECC is not changed by the proposed techniques of the present disclosure, no adaptation would be necessary at the receiving side/end, thereby further contributing to the improvement of the efficiency and die size. In addition, CCF mitigation mechanisms could be relaxed due to diversity (i.e., a (separate/standalone) detection circuit as proposed in the present disclosure vs. a completely redundant ECC decoder in some conventional techniques). Finally, it is also to be noted that the concept of the present disclosure is devised in such a manner that it is generally not limited to any specific single ECC application (e.g., only applicable to ECC based sync bridges), but can generally be used whenever an ECC decoder is used (which may include, but is certainly not limited thereto, volatile/non-volatile memories, bus, sync bridges, internally in Ips, etc.), thereby improving the flexibility in terms of applicability of the present disclosure.

It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above, and/or to providing and/or arranging respective elements of these circuits.

It is to be further noted that examples of embodiments of the disclosure are applicable to various system configurations, depending on the underlining technical fields. In other words, the examples shown in the above described figures, which are used as a basis for the above discussed examples, are only illustrative and do not limit the present disclosure in any way. That is, additional further existing and proposed new functionalities available in a corresponding operating environment may be used in connection with examples of embodiments of the present disclosure based on the principles defined.

It should also be noted that the disclosed example embodiments can be implemented in many ways using hardware and/or software configurations. For example, the disclosed embodiments may be implemented using dedicated hardware, dedicated software, and/or hardware in association with software executable thereon. The components and/or elements in the figures are examples only and do not limit the scope of use or functionality of any hardware, software in combination with hardware, firmware, embedded logic component, or a combination of two or more such components implementing particular embodiments of the present disclosure.

Finally, it should be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method.

Furthermore, all statements herein providing principles, aspects, and embodiments of the invention, as well as specific examples thereof, are intended to encompass equivalents thereof.

What is claimed is:

1. A detection circuit for detecting faulty operation of an error correction code (ECC) decoder that is configured for diagnosing whether an error has occurred in input data to the ECC decoder, wherein the ECC decoder is further configured for outputting an error detection signal indicative of whether the error has been detected and potentially corrected by the ECC decoder and output data based on the input data, and wherein the detection circuit comprises:

a first stage configured to generate a first check signal indicative of whether there is a mismatch between the input data and the output data of the ECC decoder; and a second stage configured to generate a second check signal indicative of whether faulty operation of the ECC decoder has been detected based on the first check signal and the error detection signal of the ECC decoder, wherein the ECC decoder comprises a data correction component configured for correcting the error detected by the ECC decoder, and wherein the second check signal generated by the second stage indicates that the data correction component of the ECC decoder is faulty, if the first check signal indicates that there is the mismatch between the input data and the output data of the ECC decoder while the error detection signal of the ECC decoder indicates that no error has been detected by the ECC decoder.

2. The detection circuit according claim 1,
wherein the first stage is configured to generate the first check signal indicating that there is the mismatch between the input data and the output data of the ECC decoder if the input data is different from the output data.

3. The detection circuit according to claim 1,
wherein the mismatch between the input data and the output data of the ECC decoder indicates that the input data has been modified by the ECC decoder.

4. The detection circuit according to claim 1,
wherein the second stage is configured to generate the second check signal indicating that faulty operation of the ECC decoder has been detected if:
the first check signal indicates that there is the mismatch between the input data and the output data of the ECC decoder while the error detection signal of the ECC decoder indicates that no error has been detected by the ECC decoder, or
the first check signal indicates that there is no mismatch between the input data and the output data of the ECC decoder while the error detection signal of the ECC decoder indicates that the error has been detected by the ECC decoder.

5. The detection circuit according to claim 1,
wherein the first stage comprises:
a plurality of XOR gates that are configured to take respective parts of the input data and the output data of the ECC decoder as input; and
an OR gate coupled to the plurality of XOR gates that is configured to generate the first check signal based on outputs of the plurality of XOR gates.

6. The detection circuit according to claim 5,
wherein the input data and the output data each is represented by a sequence of bits, and
wherein a count of bits of the output data equals a count of the plurality of XOR gates.

7. The detection circuit according to claim 6,
wherein the generation of the first check signal comprises bit-wise comparing the input data with the output data using the plurality of XOR gates.

8. The detection circuit according to claim 1,
wherein the second stage comprises an XOR gate that is configured to generate the second check signal indicative of whether faulty operation of the ECC decoder has been detected based on the first check signal and the error detection signal of the ECC decoder.

9. The detection circuit according to claim 1,
wherein the detection circuit further comprises a self-diagnosis module configured for testing whether the detection circuit itself is faulty.

10. The detection circuit according to claim 9,
wherein the self-diagnosis module comprises at least one inverter configured for flipping one bit of the input data or the output data before input to the plurality of XOR gates.

11. The detection circuit according to claim 1,
wherein the error in the input data includes an error involving at least one data bit.

12. The detection circuit according claim 1,
wherein at least one of the first check signal or the second check signal is a binary signal.

13. The detection circuit according to claim 1,
wherein the second check signal indicative of whether faulty operation of the ECC decoder has been detected is output for further error processing.

14. A system comprising:
a transmitting module for transmitting input data;
an error correction code (ECC) decoder that is configured for diagnosing whether an error has occurred in the input data, wherein the ECC decoder is further configured for outputting an error detection signal indicative of whether the error has been detected and potentially corrected by the ECC decoder and output data based on the input data; and
the detection circuit for detecting faulty operation of the ECC decoder according to claim 1.

15. The system according to claim 14, wherein the transmitting module relates to a memory.

16. A method for detecting faulty operation of an error correction code (ECC) decoder that is configured for diagnosing whether an error has occurred in input data to the ECC decoder, wherein the ECC decoder is further configured for outputting an error detection signal indicative of whether the error has been detected and potentially corrected by the ECC decoder and output data based on the input data, and wherein the method comprises:
generating a first check signal indicative of whether there is a mismatch between the input data and the output data of the ECC decoder; and
generating a second check signal indicative of whether faulty operation of the ECC decoder has been detected based on the first check signal and the error detection signal of the ECC decoder,
wherein the second check signal is generated to indicate that faulty operation of the ECC decoder has been detected, if there is the mismatch between the input data and the output data of the ECC decoder while the error detection signal of the ECC decoder indicates that no error has been detected by the ECC decoder, or if there is no mismatch between the input data and the output data of the ECC decoder while the error detection signal of the ECC decoder indicates that the error has been detected by the ECC decoder,
wherein the ECC decoder comprises a data correction component configured for correcting the error detected by the ECC decoder, and
wherein the method further comprises, if there is the mismatch between the input data and the output data of the ECC decoder while the error detection signal of the ECC decoder indicates that no error has been detected by the ECC decoder, determining that the data correction component of the ECC decoder is faulty.

17. A non-transitory computer-readable storage medium storing a program that causes a processor to carry out the method according to claim 16.

* * * * *